US011239318B2

(12) United States Patent
Kim et al.

(10) Patent No.: US 11,239,318 B2
(45) Date of Patent: Feb. 1, 2022

(54) HIGH-VOLTAGE DRAIN EXPENDED MOS TRANSISTOR

(71) Applicant: TEXAS INSTRUMENTS INCORPORATED, Dallas, TX (US)

(72) Inventors: Sunglyong Kim, Allen, TX (US); Seetharaman Sridhar, Richardson, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/846,754

(22) Filed: Apr. 13, 2020

(65) Prior Publication Data

US 2020/0243647 A1 Jul. 30, 2020

Related U.S. Application Data

(62) Division of application No. 15/876,989, filed on Jan. 22, 2018, now Pat. No. 10,651,274.

(Continued)

(51) Int. Cl.
*H01L 29/08* (2006.01)
*H01L 29/78* (2006.01)
(Continued)

(52) U.S. Cl.
CPC .... *H01L 29/0882* (2013.01); *H01L 21/26513* (2013.01); *H01L 29/0623* (2013.01); *H01L 29/1045* (2013.01); *H01L 29/66659* (2013.01); *H01L 29/66681* (2013.01); *H01L 29/7816* (2013.01); *H01L 29/7835* (2013.01); *H01L 29/1083* (2013.01); *H01L 29/402* (2013.01); *H01L 29/42368* (2013.01)

(58) Field of Classification Search
None
See application file for complete search history.

(56) References Cited

U.S. PATENT DOCUMENTS

| 5,156,989 A | 10/1992 | Williams et al. | |
|---|---|---|---|
| 2002/0072186 A1* | 6/2002 | Evans | H01L 29/7835 438/306 |

(Continued)

FOREIGN PATENT DOCUMENTS

WO   2006132714 A2   12/2006

OTHER PUBLICATIONS

PCT Search Report for Application No. PCT/US 2018/068126 dated Apr. 25, 2019.

(Continued)

*Primary Examiner* — Hsien Ming Lee
(74) *Attorney, Agent, or Firm* — Andrew R. Ralston; Charles A. Brill; Frank D. Cimino

(57) ABSTRACT

A semiconductor device includes a MOS transistor located within a semiconductor substrate of a first conductivity type. The transistor includes a body well located between a drain well and a substrate contact well. A buried voltage blocking region of a second conductivity type is located within the substrate and is connected to the body well. The buried voltage blocking region extends toward the substrate contact well, with an unmodified portion of the substrate remaining between the voltage blocking region and the substrate contact well.

27 Claims, 11 Drawing Sheets

Related U.S. Application Data

(60) Provisional application No. 62/611,942, filed on Dec. 29, 2017.

(51) Int. Cl.
    *H01L 29/10*    (2006.01)
    *H01L 29/06*    (2006.01)
    *H01L 29/66*    (2006.01)
    *H01L 21/265*    (2006.01)
    *H01L 29/40*    (2006.01)
    *H01L 29/423*    (2006.01)

(56) References Cited

U.S. PATENT DOCUMENTS

| | | |
|---|---|---|
| 2004/0027745 A1 | 2/2004 | Kunz et al. |
| 2008/0237656 A1 | 10/2008 | Williams et al. |
| 2013/0009253 A1 | 1/2013 | Wang et al. |
| 2013/0032863 A1 | 2/2013 | Kawahara et al. |
| 2016/0163583 A1 | 6/2016 | Liu et al. |
| 2019/0123555 A1* | 4/2019 | Kim ................ H01L 29/063 |

OTHER PUBLICATIONS

Search Report for Application No. 18897788.8-1212 / 3732730 PCT/US2018068126, dated Jun. 8, 2021.

* cited by examiner

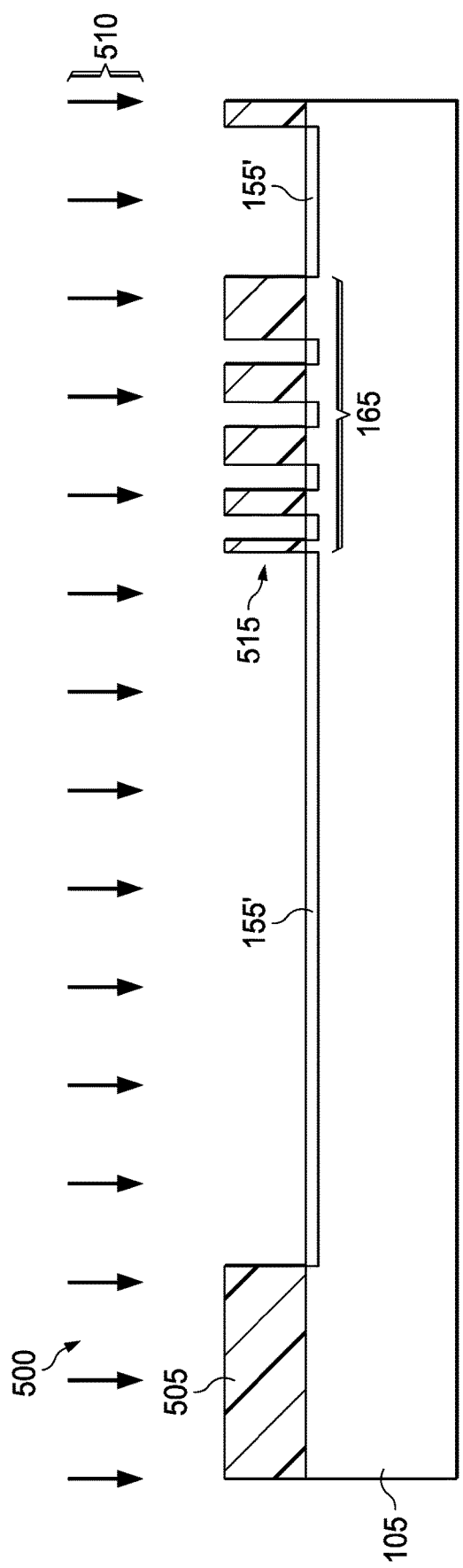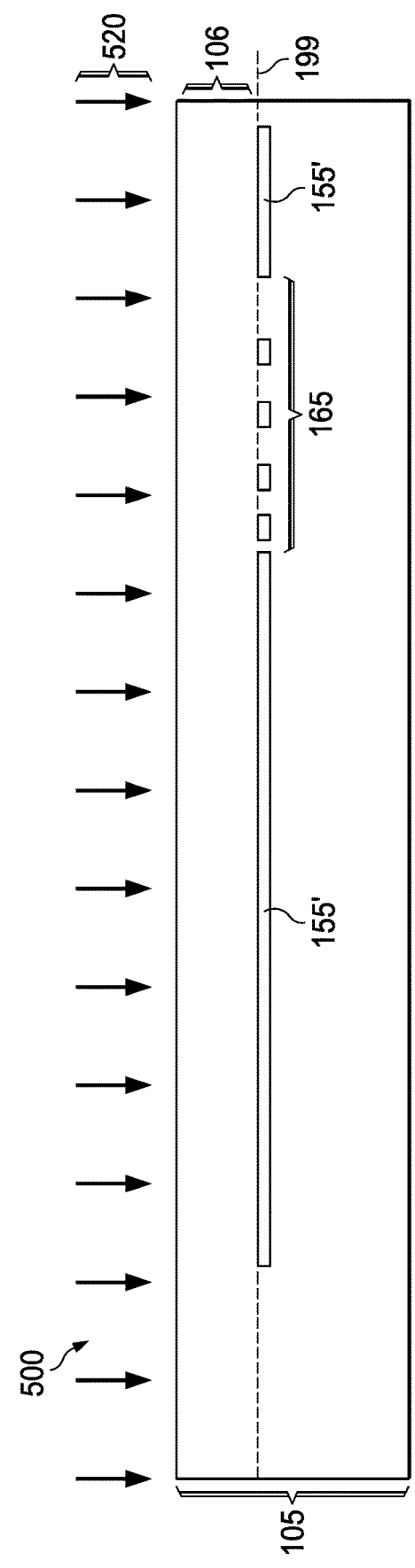
FIG. 5A
FIG. 5B

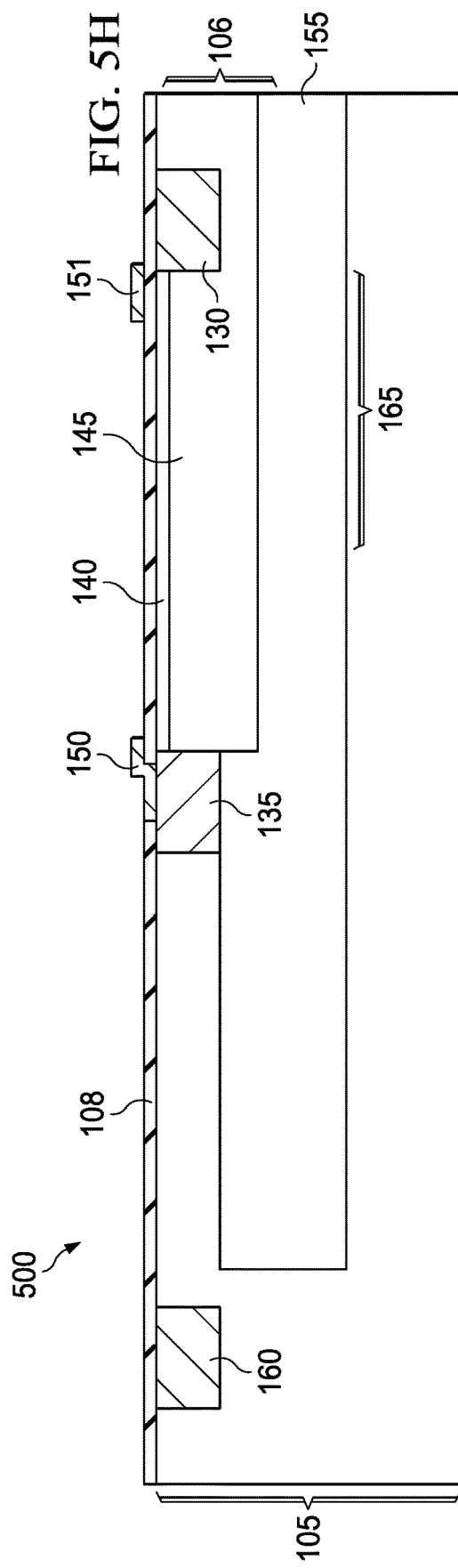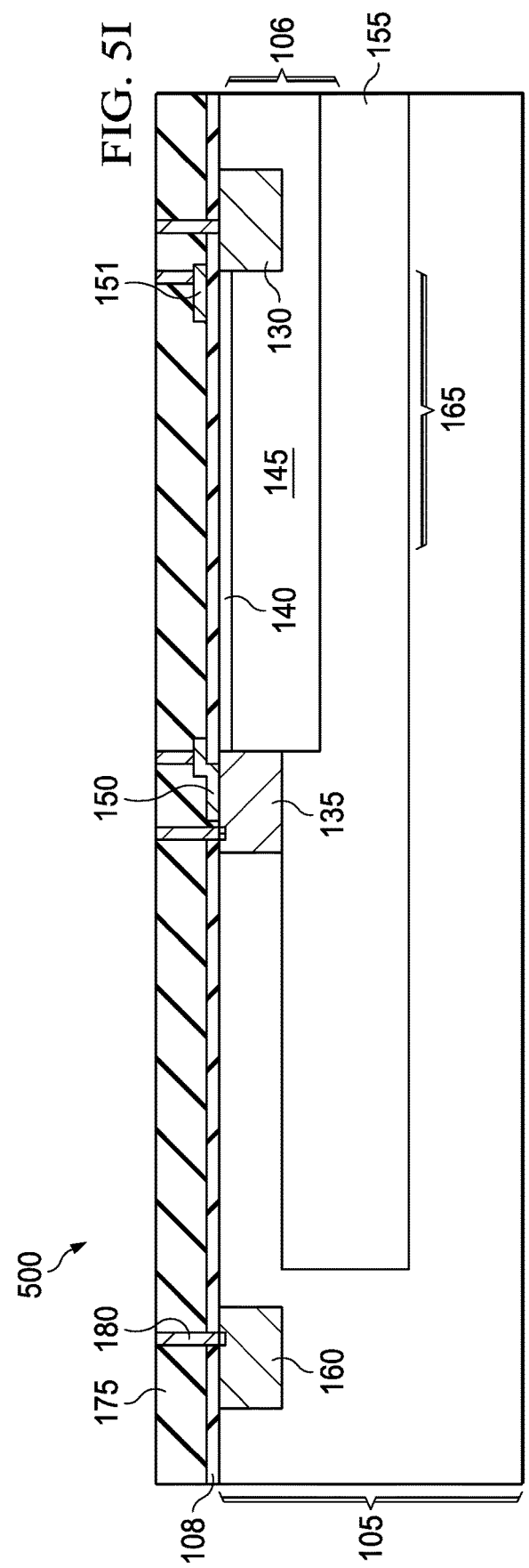

HIGH-VOLTAGE DRAIN EXPENDED MOS TRANSISTOR

RELATED APPLICATION

This application claims priority to U.S. Provisional Patent Application Ser. No. 62/611,942, filed on Dec. 29, 2017, which is incorporated herein by reference in its entirety. This application is a divisional application of U.S. patent application Ser. No. 15/876,989, the content of which is incorporated herein in its entirety.

TECHNICAL FIELD

This disclosure relates to the field of semiconductor devices, and more particularly, but not exclusively, to a drain-extended MOS transistor with improved high voltage operation.

BACKGROUND

Drain-extended (DE)-MOS transistors are used in diverse high-voltage applications, such as power RF and driving piezo-electric ultrasonic transducers. Such transistors are generally characterized by relatively high breakdown voltage between the drain and the substrate. However, some existing DEMOS transistors, in particular DE-PMOS transistors, are limited to a breakdown voltage less than about 50 V. This limit makes DE-PMOS transistors unsuitable in some applications.

SUMMARY

The inventors disclose various methods and devices that may be beneficially applied to transistors in integrated circuits (ICs). While such embodiments may be expected to provide improvements in performance and/or yield of such transistors and ICs, no particular result is a requirement of the present invention unless explicitly recited in a particular claim.

The present disclosure introduces a device, e.g. a junction-terminated drain-extended MOS transistor. The device includes a MOS transistor formed within a semiconductor substrate of a first conductivity type and having a body well located between a drain well and a substrate contact well. A buried voltage blocking region of a second conductivity type is connected to the body well and is located between the body well and the substrate contact well. An unmodified portion of the substrate is located between the buried voltage blocking region and the substrate contact well.

Another embodiment provides a method, e.g. for forming an electrical device. The method includes forming within a semiconductor substrate a body well and a drain well of a DE-MOS transistor. A junction termination diode is also formed within the substrate, and has first and second terminals. The first terminal is connected to the substrate at a substrate contact well, and the second terminal is connected to the body well.

In a further embodiment, an electronic device, e.g. a DE-MOS transistor, includes a p-type substrate and first and second $p^+$-wells located within the substrate. An n-well is located within the substrate between the first and second $p^+$-wells, and a gate is located over the n-well. A buried n-type region partially overlaps the n-well and extends from the n-well toward the first $p^+$-well. An unmodified portion of the p-type substrate is located between the first $p^+$-well and the buried n-type region.

BRIEF DESCRIPTION OF THE DRAWINGS

For a detailed description of various examples, reference will now be made to the accompanying drawings in which:

FIGS. 5A-5I illustrate in sectional view process steps that may be used to form the device of FIGS. 1 and 2 to implement the method of FIG. 4, in an example embodiment.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Figure 1:
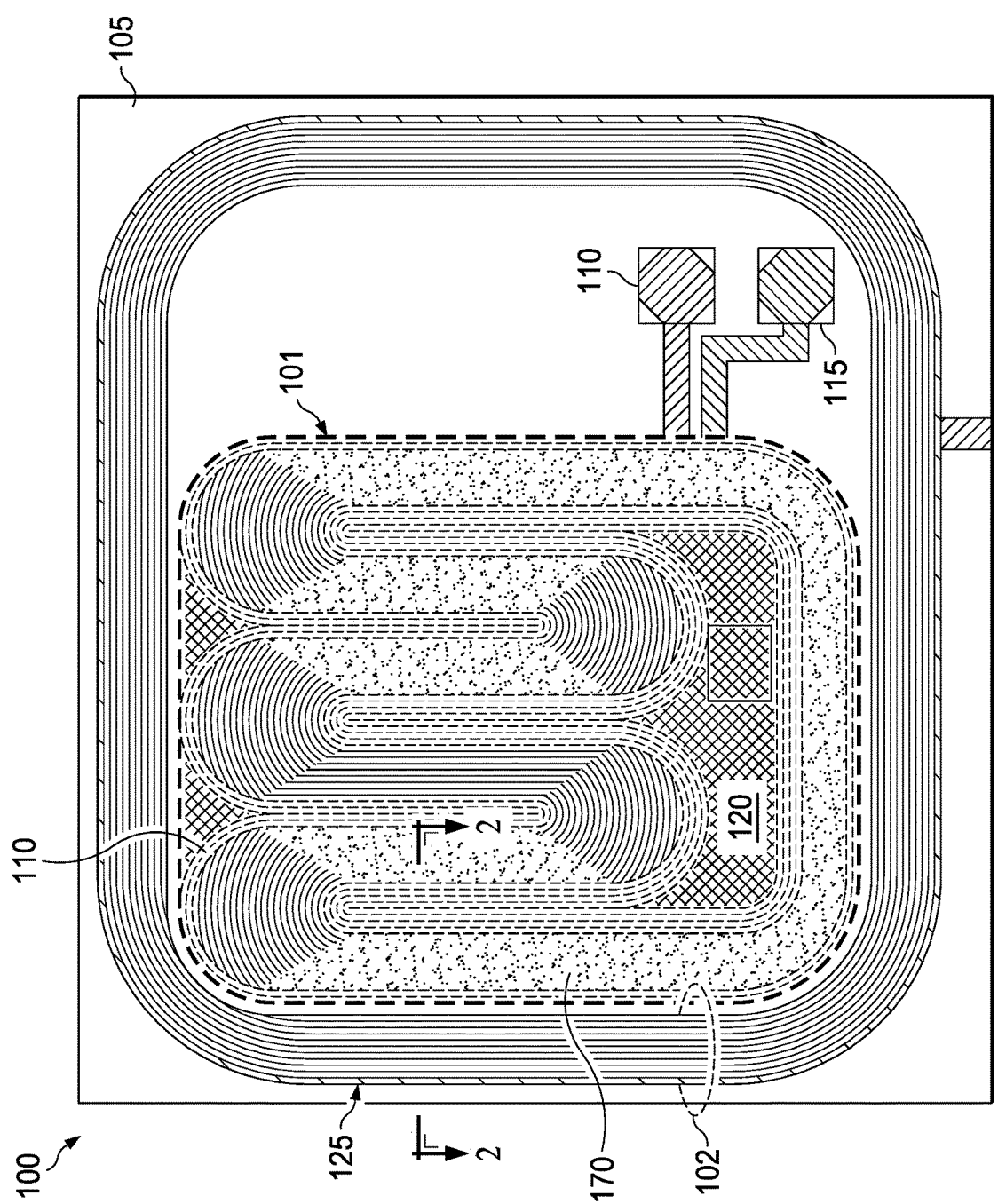
FIG. 1 presents a plan view of an LD-MOS device formed according to various embodiments.
Figure 2:
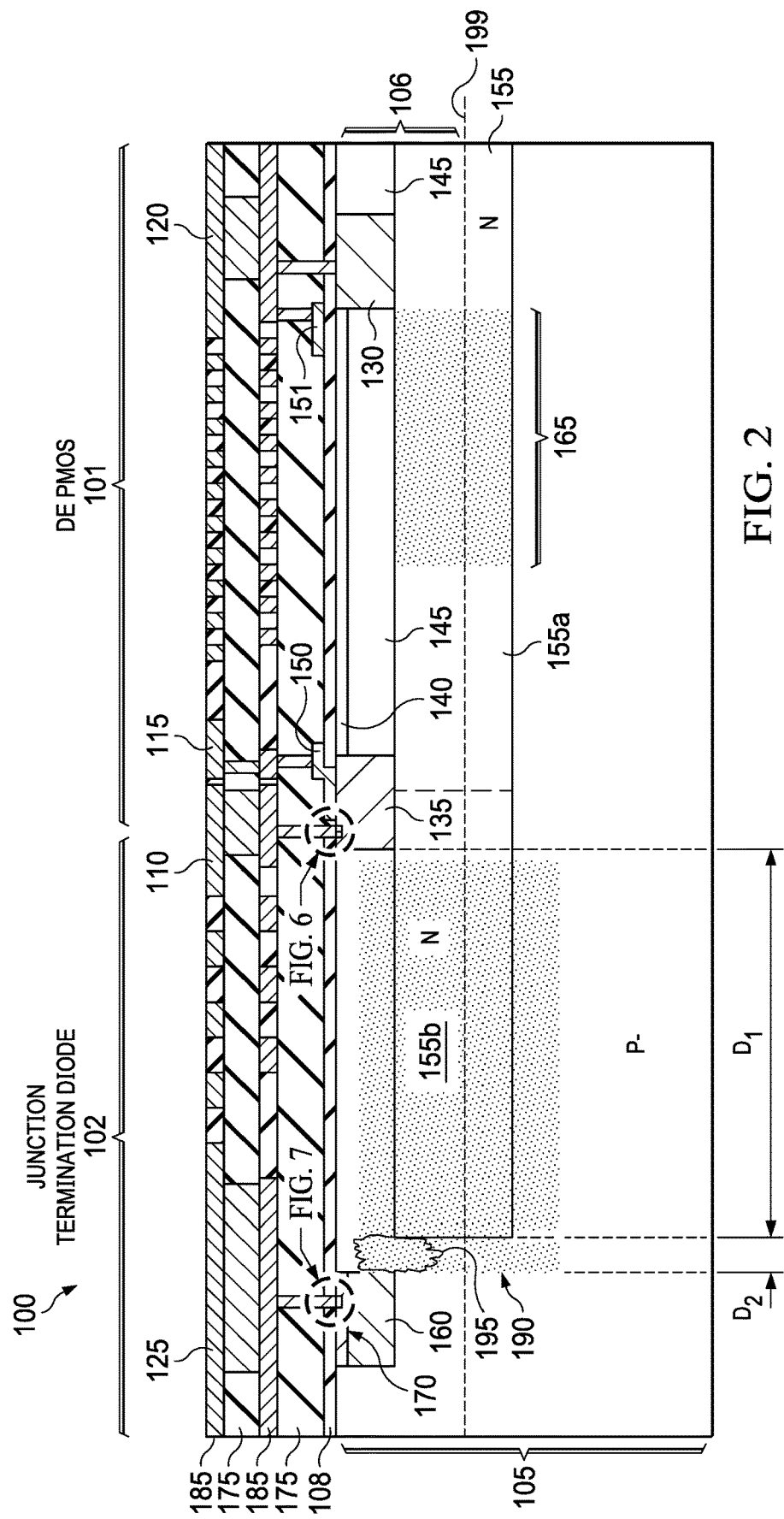
FIG. 2 presents a sectional view of the LD-MOS device of FIG. 1, in an example embodiment.

FIG. 1 presents a plan view of an electronic device 100, that includes, e.g. a drain-extended MOS transistor 101 and a junction-termination diode 102, according to various embodiments. FIG. 2 shows a view of a section of the device 100 as marked in FIG. 1. Both figures are referred to concurrently in the following discussion. Some aspects of the transistor 101 are described in this discussion in the context of a PMOS transistor without limitation thereto. Those skilled in the pertinent art will appreciate that the principles of the described embodiments may be adapted for use with an NMOS transistor by suitable modification without undue experimentation.

The device 100 is formed over a substrate 105, wherein in the illustrated embodiment the junction termination diode 102 surrounds the transistor 101. As discussed further below, the diode 102 provides breakdown protection that enables the transistor 101 to operate at a higher source voltage than would otherwise be possible in some applications. The substrate 105 includes a lightly-doped epitaxial ("epi") layer 106 of a first polarity type, e.g. p-type. The epi layer 106 may be doped with, e.g. boron, to a resistivity within a range from about 1 ohm-cm to about 20 ohm-cm, corresponding to a dopant concentration within a range from about 7e14 atoms/cm$^3$ to about 1.4e16 atoms/cm$^3$. The substrate 105 below the epi layer 106 may have a higher resistivity, e.g. within a range from about 50 ohm-cm to about 200 ohm-cm. A field oxide layer 108 overlies the epi layer 106. The transistor 101 includes a source electrode 110, a gate electrode 115 and a drain electrode 120. The diode 102 is connected to a substrate electrode 125 and the source electrode 110. While the transistor 101 and the diode 102 share the source electrode 110 in the illustrated embodiment, other embodiments may provide a separate contact for the source of the transistor 101 and the diode 102.

The transistor 101 further includes a drain well 130 having the first polarity type, e.g. p-type, and a body well 135 having a second polarity type, e.g. n-type. The drain well 130 may be heavily doped, denoted "p+", meaning this region may be more heavily doped than the epi layer 106, e.g. at least about $10^{16}$ dopant atoms/cm$^3$, or a conductivity of about 0.5 ohm-cm or less. The drain well 130 is connected to the drain electrode 120 by a via 180, and the body well 135 is connected to the source electrode 110 by another via 180.

A surface drift region 140 of the first conductivity type, e.g. p-type, is located in a surface layer between the drain well 130 and the body well 135, and provides a current path from the drain well 130 to the body well 135. The drift region 140 may operate as an extended drain of the transistor 101. In such embodiments the $I_{DL}$ (drain current under load) of the transistor 101 may be larger than in embodiments in which the unmodified epi layer 106 is used as the drift region.

In some embodiments the transistor 101 includes an HV well 145 located between the body well 135 and the drain well 130. The HV well 145 is doped with a dopant species of the second conductivity type, e.g. an n-type dopant when the epi layer 106 is a p-type and the transistor 101 is a PMOS transistor. In such embodiments the HV well 145 may help spatially define the drift region 140, and may also provide charge balance for high-voltage blocking in the transistor off-state.

A gate 150, e.g. comprising polysilicon, is located over the body well 135, with a gate dielectric 640 (see FIG. 6) located between the gate 150 and the body well 135. The gate 150 is connected to the gate electrode 115 by another via 180. A polysilicon field plate 151, located over the HV well 145, may be formed concurrently with the gate 150, and connected by another via 180 to the drain electrode 120. The field plate 151 may help reduce the electric field between the drain well 130 and the HV well 145 where the electric field may concentrate.

Figure 6:
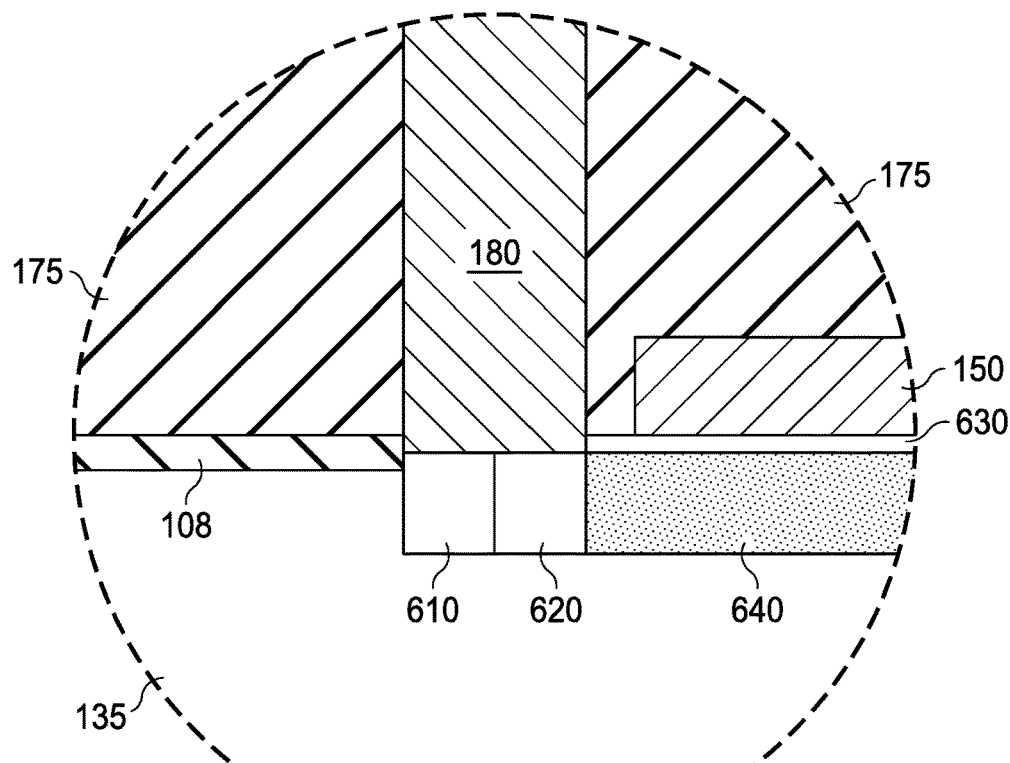
FIGS. 6 and 7 presents detail views of portions of the LD-MOS device of FIG. 2, in example embodiments.

FIG. 6 shows a detail view of a portion of the body well 135, the gate 150, and associated via 180. Two additional doped regions provide an interface between the body well 135 and the via 180. A body contact 610, e.g. n+-doped, may provide an ohmic connection between via 180 and the body well 135. A source region 620, p+-doped, may operate the source of the PMOS transistor. In the illustrated embodiment the body contact 610 and the source region 620 are held at a common potential by their common connection to the via 180. In other embodiments the body contact 610 and source region 620 may not be at a common potential, as determined by specific device applications. A gate dielectric 630, e.g. thermal oxide, is located between the gate 150 and the body well 135. A body channel region 640, n-type in the present example, is located between the source region 620 and the drift region 140 (FIG. 2). The body channel region 640 includes that part of the body well 135 located beneath the gate 150, extending into the body well 135 by about the depth of the source region 620. The body channel region 640 may be depleted by a negative voltage on the gate 150, allowing conduction between the source region 620 and the drain well 130.

Returning to FIG. 2, a buried voltage blocking region 155 of a second conductivity type, e.g. n-type, is connected to the body well 135. "Buried" means that a portion of the epi layer 106 is located between the voltage blocking region 155 and the field oxide layer 108. In this context, "connected" means that the body well 135 partially overlaps the voltage blocking region 155 such that dopants from the body well 135 and dopants from the voltage blocking region 155 are both located in the overlapping portion. A first portion 155a of the voltage blocking region 155 extends laterally from the body well 135 to the drain well 130 and partially overlaps these regions. A second portion 155b extends toward a substrate contact well 160.

The voltage blocking region 155 is a lightly doped region of the second conductivity type, e.g. n-type when the epi layer 106 is p-type. In the context of the voltage blocking region 155, "lightly doped" means that the voltage blocking region 155 has a resistivity within a range between about 50 ohm-cm and about 200 ohm-cm. When the n-type dopant is phosphorous, this corresponds to a dopant concentration within a range from about 2e13 atoms/cm$^{-3}$ to about 9e13 atoms/cm$^{-3}$. The voltage blocking region 155 may be formed by implanting a dopant of the second conductivity type into the epi layer 106 with sufficient energy to produce a buried region in which the conductivity type is converted from the first conductivity type to the second conductivity type, while leaving a portion of the epi layer 106 between the voltage blocking region 155 and the field oxide layer 108 remaining.

Within the transistor 101, the voltage blocking region 155 may contribute to high voltage blocking by forming a spatially diffuse depletion region below the drift region 140 and HV well 145. In some embodiments, as illustrated, the voltage blocking region 155 overlaps a portion of the HV well 145. Optionally, the dopant concentration in the voltage blocking region 155 may be graded in a region 165 of the first portion 155a of the voltage blocking region 155 such that the dopant concentration in the voltage blocking region 155 decreases in the direction of the drain well 130. This aspect is described further below.

Figure 7:
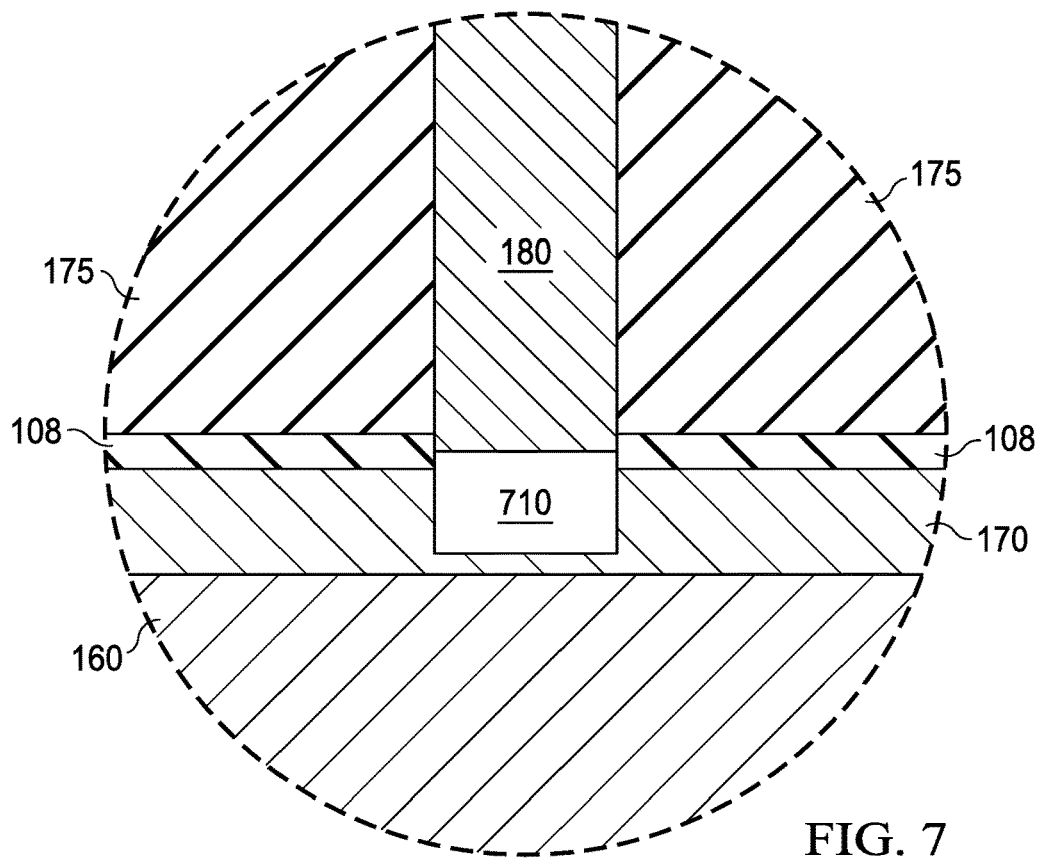

The diode 102 includes the body well 135 and the substrate contact well 160, e.g. a p-well. FIG. 7 shows a detail view of a portion of the substrate contact well 160 and the associated via 180. In some embodiments the substrate contact well 160 is more heavily doped than the drain well 130. A portion 170 of the implant that produces the drift region 140 may be present in the substrate contact well 160. A p+-doped contact region 710 helps provide an ohmic connection between the substrate contact well 160 and the associated via 180. A similar p+-doped contact region may be used for the same purpose in the drain well 130.

The substrate contact well 160 provides a first terminal of the diode 102, and the body well 135 may provide a second terminal. The substrate contact well 160 provides a connection to the epi layer 106 via the substrate electrode 125. In this case the body well 135 and the second terminal of the diode 102 are coincident. In other embodiments, not shown, the second terminal of the diode 102 may be separate and distinct from the body well 135.

The diode 102 further includes that portion of the epi layer 106 between the body well 135 and the substrate contact well 160. The second portion 155b of the voltage blocking region 155 extends laterally a distance $D_1$ from the body well 135 toward the substrate contact well 160, with an unmodified portion 195 of width $D_2$ of the epi layer 106 located between the second portion 155b and the substrate contact well 160 such that the voltage blocking region 155 is spaced apart laterally from the substrate contact well 160. In this context, "unmodified" means the dopant concentration of that portion of the epi layer 106 has not been altered from its original state. Thus, for example, if the epi layer 106 is p-type with a resistivity ρ, the portion 195 between the substrate contact well 160 and the voltage blocking region 155 remains p-type with a resistivity ρ.

As stated earlier, the diode 102 provides breakdown protection to the transistor 101. In general, the high-voltage protection provided by the diode 102 depends at least in part on $D_1$ and $D_2$, with the protection provided by $D_1$ expected to dominate. In general, a larger value of $D_1$ provides a higher breakdown voltage for the body well 135. In various embodiments the voltage blocking region 155 extends laterally from the body well 135 toward the substrate contact well 160 by at least about 80% of $D_1+D_2$. In other words, in such embodiments $D_1$ may be at least four times $D_2$. In other embodiments the voltage blocking region 155 extends laterally at least about 20 μm toward the substrate contact well 160 from the body well 135, $D_1 \geq 20$ μm. This distance is expected to provide at least about 100 V breakdown protection for the body well 135 when the substrate 105 is silicon. In other embodiments $D_1$ may be 200 μm or more. At a distance of 200 μm the diode 102 is expected to provide about 2000 V breakdown protection for the body well 135. While $D_1$ can be made larger, with correspondingly larger breakdown voltage protection, such protection may be balanced against the area required. Thus $D_1$ may be determined according to the anticipated breakdown risk and required device area. In some embodiments, the width $D_2$ may be in a range from about 20 μm to about 200 μm. However, since the breakdown voltage protection provided by the diode 102 is expected to be dominated by $D_1$, larger values of $D_2$ may provide little practical additional benefit.

Finally, dielectric layers 175 and metal layers 185 are located over the substrate 105 to provide connections from the electrodes 110, 115, 120 and 125 respectively to the body well 135, the gate 150, and the wells 130, 160. Various unreferenced metal features in the illustrated metal layers 185 may include, e.g., dummy metal features, interconnection lines, etc.

As understood by those skilled in the art, an equilibrium depletion region forms between the epi layer 106 and the voltage blocking region 155 by virtue of the semiconductor junction therebetween. During operation, a potential may be placed across the substrate electrode 125 and the source electrode 110 that causes a nonequilibrium depletion region 190 to be larger than the equilibrium depletion region. Because the voltage blocking region 155 and the epi layer 106 are lightly doped, the nonequilibrium depletion region may include a substantial portion of the voltage blocking region 155, up to substantially all of the voltage blocking region 155 between the body well 135 and the substrate contact well 160, and that portion of the epi layer 106 between the voltage blocking region 155 and the field oxide layer 108. This condition is referred to as "fully depleted". Thus the magnitude of the electric field between the body well 135 and the substrate contact well 160 may be limited to a value below the breakdown voltage of the epi layer 106, and these depleted regions form a depletion isolation region that insulates the body well 135 from the substrate contact well 160. Since the body well 135 may serve as both the source of the transistor 101 and the second terminal of the diode 102, the depletion region 190 operates as a junction termination around the transistor 101, insulating it from the substrate contact well 160. Thus the transistor 101 may be operated with a higher source voltage than would be possible in the absence of the diode 102.

Figure 3:
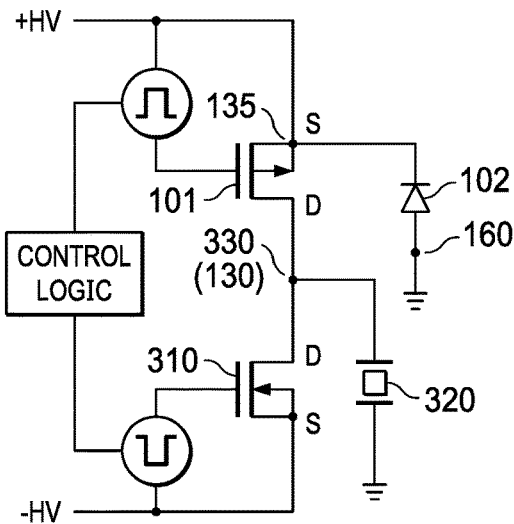
FIG. 3 illustrates an example push-pull driver circuit including the LD-MOS device of FIGS. 1 and 2.

In but one example the device 100 may find utility in applications in which the transistor 101 is a PMOS transistor employed as a high-side transistor in, e.g. a piezo-electric transducer driver circuit. FIG. 3 illustrates such a representative circuit without limitation. In this figure the transistor 101, shown in this embodiment as a PMOS transistor, and an NMOS transistor 310 are operated to provide a symmetric push-pull waveform to a transducer 320. A node 330 may maintain a ground potential under such conditions, placing the supply potential across the body well 135 and the body of the transistor 101. In the absence of the diode 102, this potential could exceed the breakdown strength of the substrate 105 material, e.g. silicon. However, the isolation provided by the diode 102 adds a measure of high voltage protection to the source-body path by distributing the voltage drop across the distance $D_1$.

Figure 4:
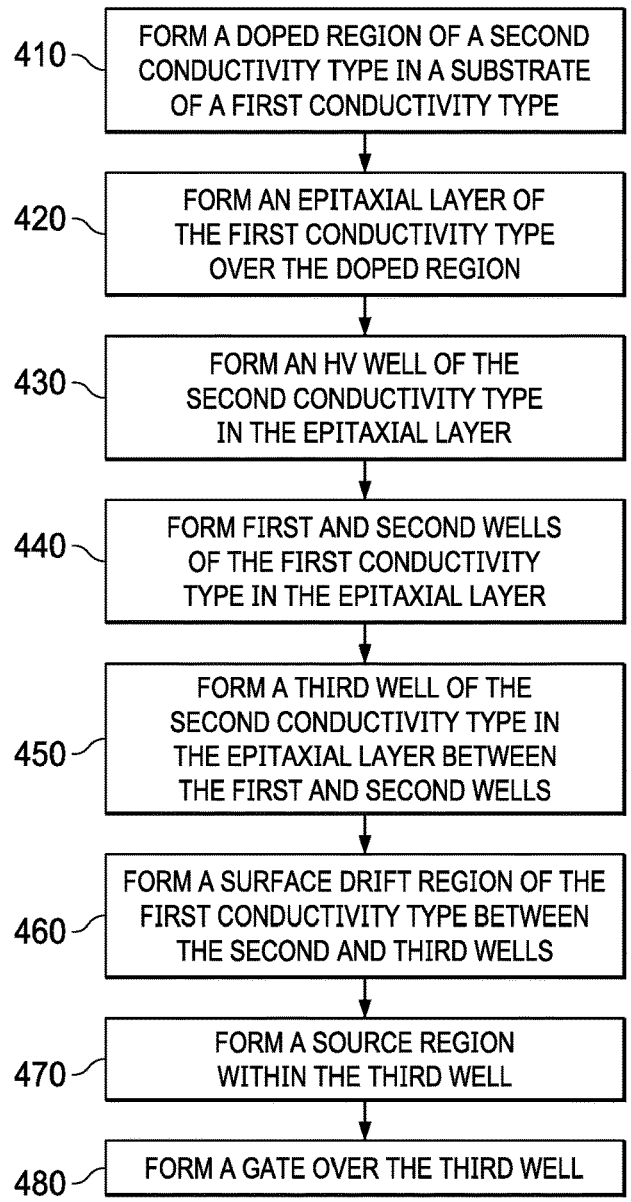
FIG. 4 illustrates an embodiment of a method of forming the LD-MOS device of FIGS. 1 and 2.

Turning to FIG. 4 an embodiment is presented of a method 400 of forming a junction-terminated MOS transistor such as the device 100. In a first step 410, a substrate is provided of the first conductivity type, e.g. p-type. An implanted region is formed with a dopant of the second opposite conductivity type, e.g. n-type. The lateral boundaries of the implanted region at the substrate surface correspond to the desired lateral extent of the buried voltage blocking region 155. Sufficient dopant of the second conductivity type is implanted to act as a dopant source to form the voltage blocking region 155 at a later diffusion step. In a step 420, an epitaxial layer of the first conductivity type, e.g. the epi layer 106, is formed over the implanted region.

In a step 430, a well of the second conductivity type, e.g. the HV well 145, is formed within the substrate and connected to the doped region. In a step 440, first and second wells of the first conductivity type are formed in the epi layer. For example, the first well may be the substrate contact well 160, and the second well may be the drain well 130. The drain well 130 is formed at one end of the HV well 145. In a step 450, a third well of the second conductivity type, e.g. an n-type body well 135, is formed in the substrate between the wells of the first conductivity type. The body well 135 is formed at an opposite end of the HV well 145 from the drain well 130.

In a step 460, a surface drift region, e.g. the surface drift region 140, is formed in the substrate from a dopant of the first conductivity type, and connects to the second and third wells. In a step 470, a source region, e.g. the source region 620, is formed within the third well from a dopant of the first conductivity type. In a step 480, a gate structure, e.g. the gate 150, is formed over the third well to form a DE-MOS transistor in which the second well is a drain well.

An activation/diffusion anneal may be performed after one or more of the steps 420-470. The anneal(s) will in general cause the dopants in the various implanted regions to diffuse into the substrate 105 vertically and horizontally from their original implanted locations. Vertical diffusion will cause the dopant implanted into the substrate 105 in step 410 to diffuse deeper into the substrate and also toward the surface. Similarly, the dopants in the regions 130, 135, 145 and 160 will diffuse laterally and deeper into the substrate 105. The dopant profiles after diffusion result in the overlapping portions illustrated in FIG. 2. For example, the voltage blocking region 155 is connected to the second and third wells, partially overlaps the HV well 145, and extends from the third well toward the first well. An unmodified portion of the substrate remains between the first well and the voltage blocking region 155. The voltage blocking region 155 may be about centered on a plane 199 representing the original surface of the substrate 105 prior to formation of the epi layer 106, though no detectable interface may be present.

FIGS. 5A-5I present an embodiment of a method 500 of forming the device 100, with sectional views at various stages of manufacturing. The method 500 is described for the embodiment in which that the transistor 101 is a PMOS transistor. Those skilled in the pertinent art are able to adapt the described method to produce a similar NMOS device without undue experimentation.

In FIG. 5A, the device 100 is shown in an early stage of manufacture. The substrate 105 comprises a crystalline semiconductor material suitable for forming electronic devices in a wafer production facility. For example, the substrate 105 may be a polished silicon wafer of the first conductivity type, e.g. p-type. A photoresist pattern 505 defines an exposed implant area of the substrate 105. The implant area may correspond to the lateral extent of the buried voltage blocking region 155 in the plane of the substrate 105. An implant process 510 provides a dopant of the second conductivity type, e.g. n-type. The implanted dopant forms a layer 155' that is shallower and more concentrated than the voltage blocking region 155. As described further below, the layer 155' acts as a dopant source in a later diffusion step that forms the voltage blocking region 155.

In an example embodiment phosphorous may be implanted with an energy of about 100 keV and a dose in a range from about 1e12 atoms/cm$^2$ to about 1e13 atoms/cm$^2$. A comb pattern 515 has been located to produce an implant pattern that results in an optional lateral dopant gradient, or graded dopant profile, in the region 165 (see also FIG. 2). In the illustrated embodiment, where portions of the comb pattern 515 are narrower a greater amount of the dopant will reach the substrate 105, and where portions of the comb pattern 515 are wider a lesser amount of dopant will reach the substrate 105. Thus the dopant concentration will decrease in the direction of increasing width of the resist lines in the comb pattern 515. Such a dopant gradient is referred to herein as a graded dopant profile. Preferably the doping gradient in the region 165 is about linear.

In FIG. 5B, an epitaxial growth process 520 forms the epi layer 106 over the layer 155'. The process 520 may be a chemical vapor deposition (CVD) process, and may include a dopant such that the epi layer 106 has the same conductivity type as the substrate 105 with a resistivity in a range from about 1 ohm-cm to about 20 ohm-cm.

Figure 5C:
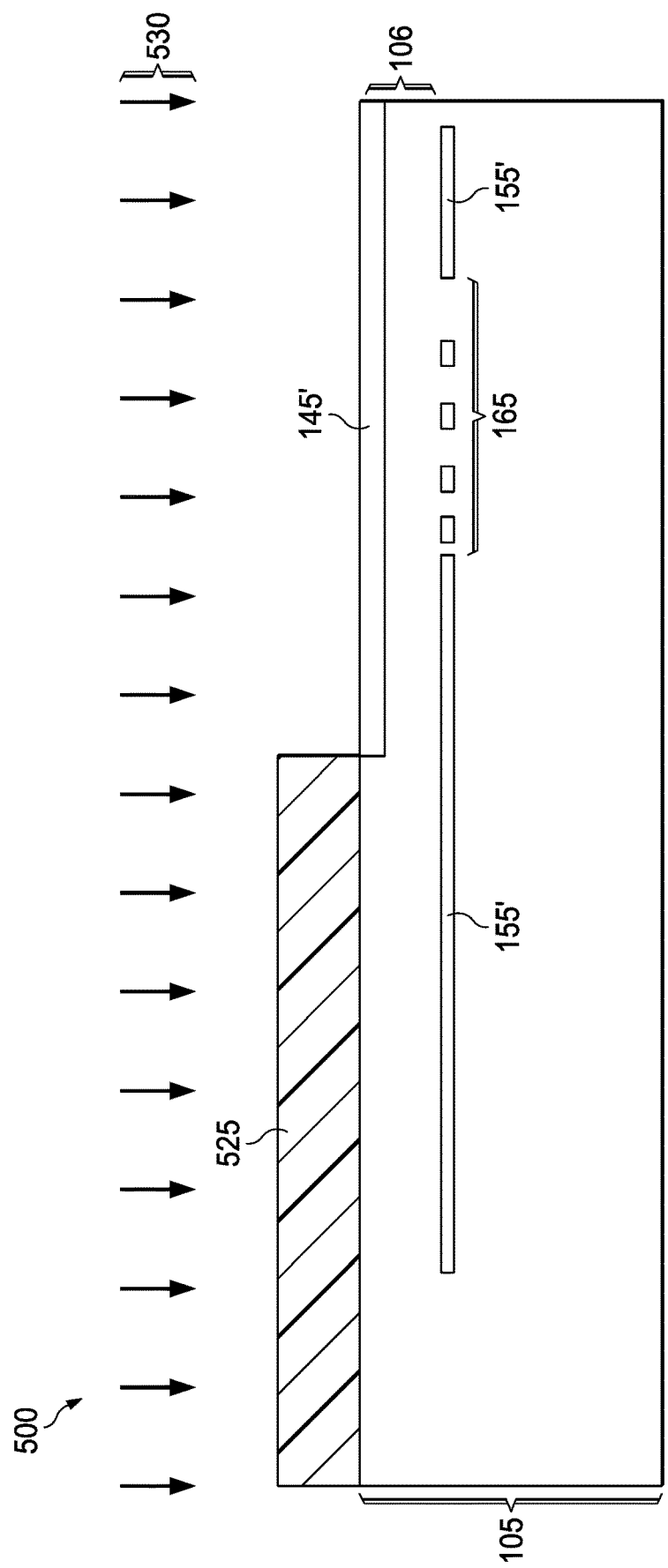

FIG. 5C illustrates an optional step in which a doped region 145' is formed in the epi layer 106. A pattern 525 includes an opening that defines the extent of the doped region 145', which corresponds to the desired extend of the HV well 145. An implant process 530 delivers to the epi layer 106 a dopant of the second conductivity type to form the doped region 145'. For example, phosphorous may be implanted with an energy of about 500 keV and a dose in a range from about 1e12 atoms/cm$^2$ to about 1e14 atoms/cm$^2$. The doped region 145' provides dopant that, at a later thermal process step, will diffuse vertically into the epi layer 106 to form the HV well 145.

Figure 5D:
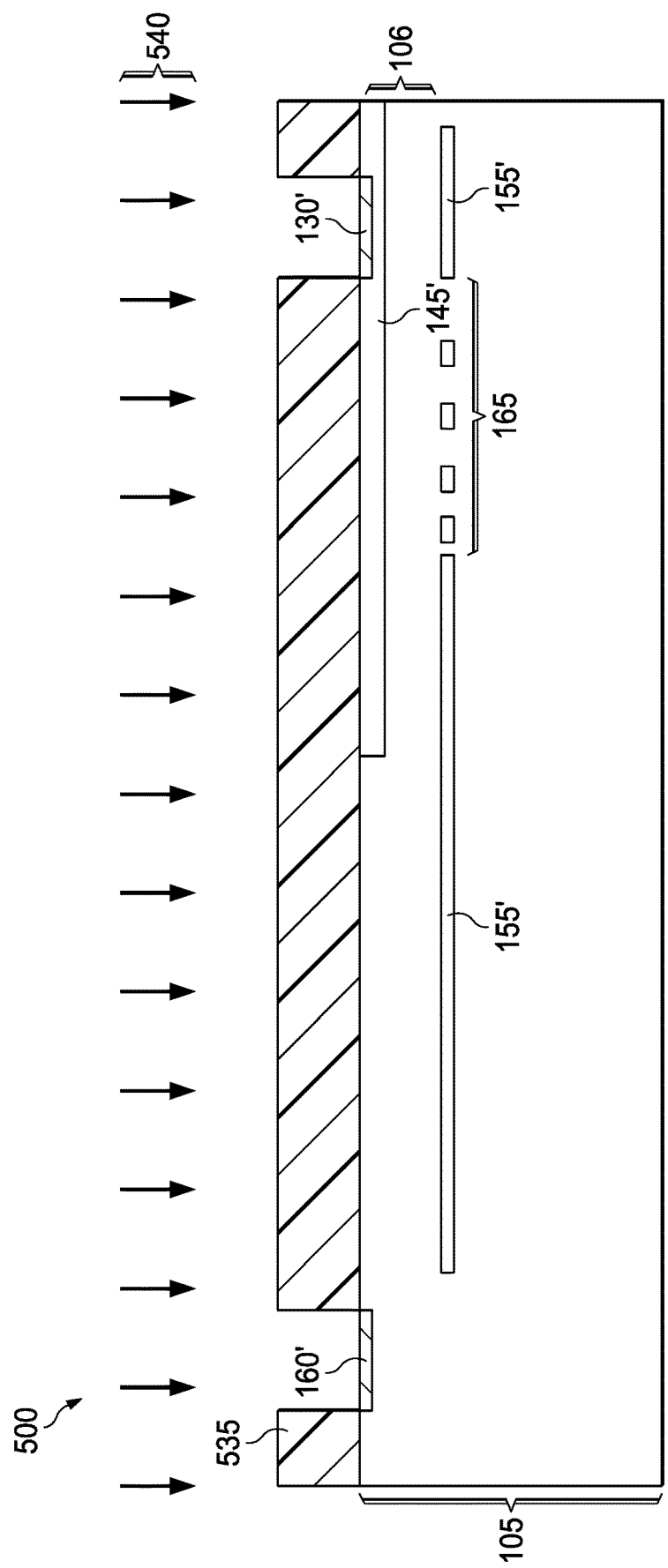

In FIG. 5D the device 100 is shown during formation of doped regions 130', 160' that will be diffused in a later process step to form the drain well 130 and the substrate contact well 160. Openings in a resist pattern 535 correspond to the desired locations of the wells 130, 160. An implant process 540 delivers a dopant species of the same conductivity type as the epi layer 106, e.g. boron, to the epi layer 106. The dopant species is implanted to a depth such that at a later thermal process the dopant will vertically diffuse into the epi layer 106 to produce the desired dopant profile in the wells 130, 160. In an example embodiment of the implant process 540, boron may be implanted with an energy of about 50 keV and a dose within a range from about 1e13 atoms/cm$^2$ to about 1e15 atoms/cm$^2$. In some embodiments, the opening to the region 130' may be formed in a comb pattern such that the concentration of dopant in the region 130' is less than the concentration of dopant in the region 160', resulting in a dopant concentration in the drain well 130 that is less than a dopant concentration in the substrate contact well 160.

Figure 5E:
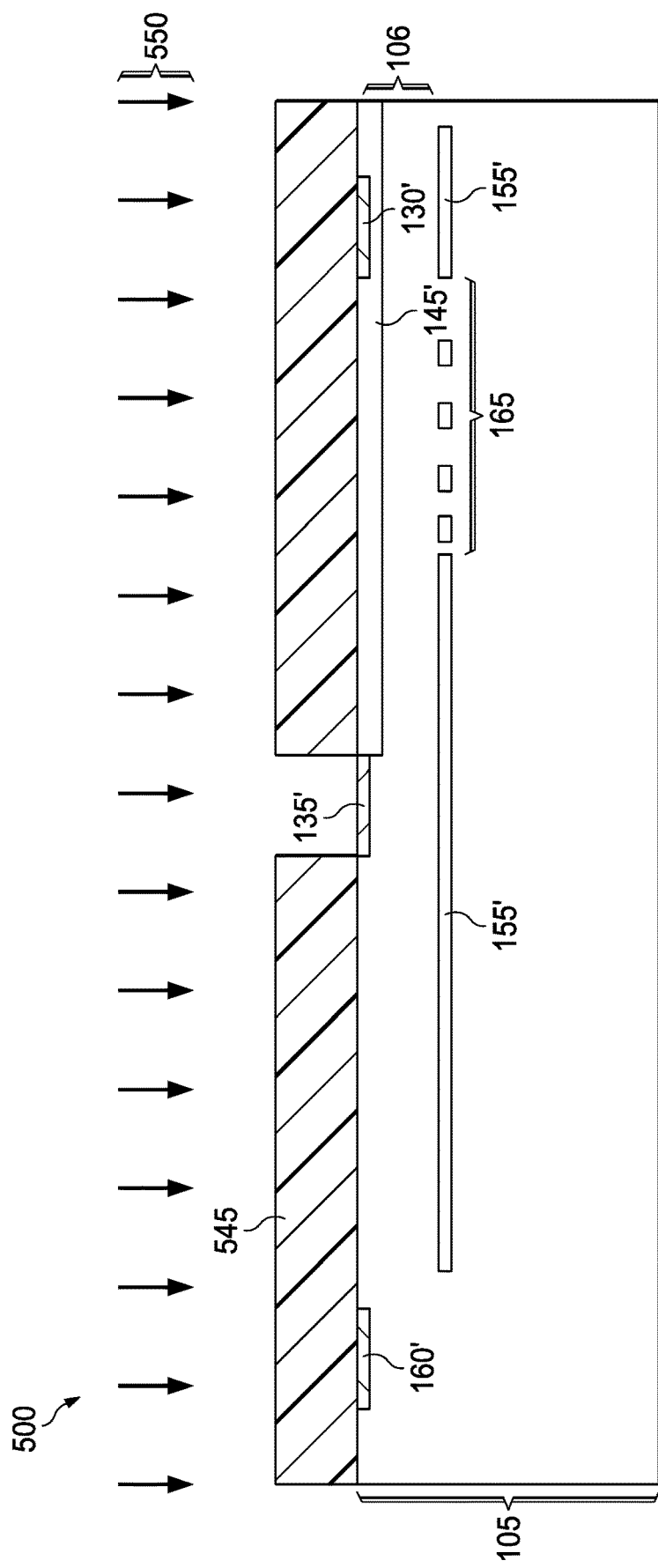

In FIG. 5E the device 100 is shown during formation of a doped region 135' that will later form the body well 135. A resist layer 545 has been patterned to produce an opening through which an implant process 550 delivers a dopant species of the second conductivity type, e.g. phosphorus, to the epi layer 106. The opening corresponds to the location of the body well 135, and may partially overlap the region 145'. In an example embodiment of the implant process 550, phosphorous may be implanted with an energy of about 200 keV and a dose within a range from about 1e13 atoms/cm$^2$ to about 1e15 atoms/cm$^2$.

Figure 5F:
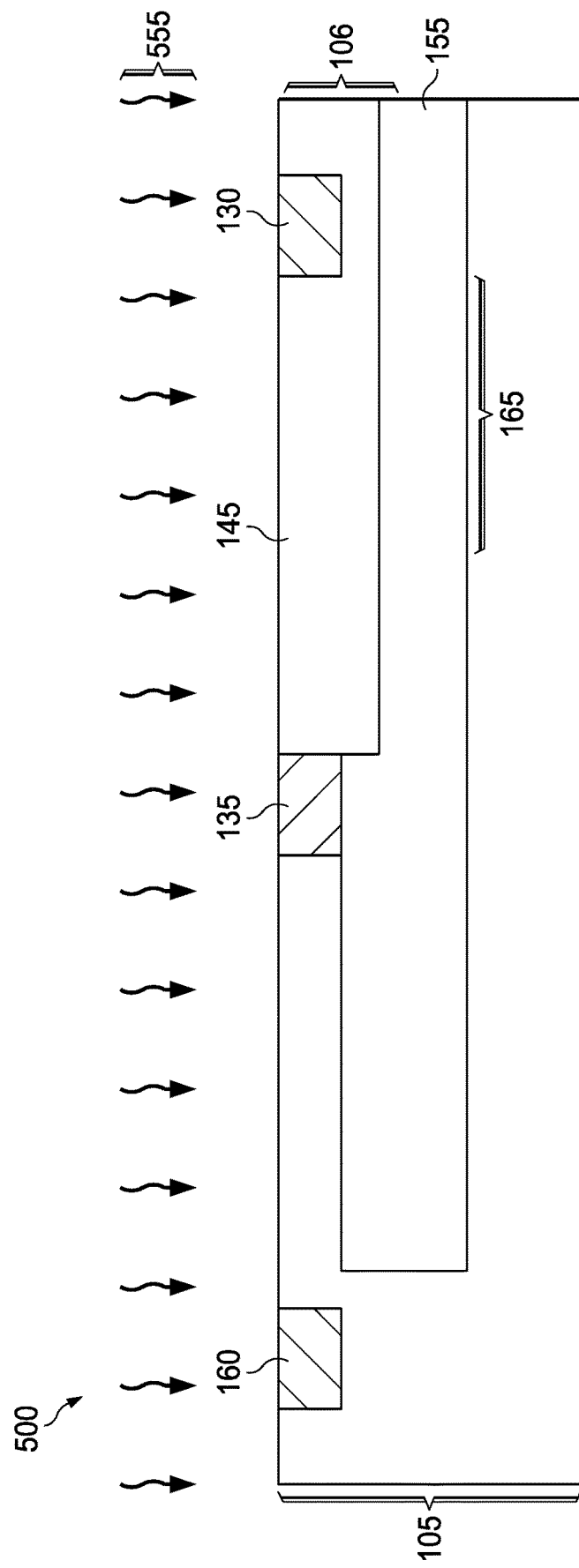

FIG. 5F illustrates the substrate 105 being exposed to a thermal diffusion process 555. The process 555 is representative of one or more diffusion steps that may follow any of the preceding implantation steps. For example, any of the previous implanted regions may be partially diffused prior to the diffusion process 555. In one embodiment, no diffusion process is performed before the diffusion process 555. In an example embodiment the thermal diffusion process 555 is performed in a tube furnace in a nitrogen ambient at 100° C. for 400 minutes.

The diffusion process 555 causes the dopant in each of the implanted regions to diffuse laterally and vertically in the substrate 105 to result in the desired configuration of doped regions of the device 100. For example, the HV well 145 partially overlaps the body well 135 and the voltage blocking region 155, and the buried voltage blocking region 155 is connected to both the drain well 130 and the body well 135. Moreover a portion of the unmodified epi layer 106 is located between the substrate contact well 160 and the voltage blocking region 155.

Figure 5G:
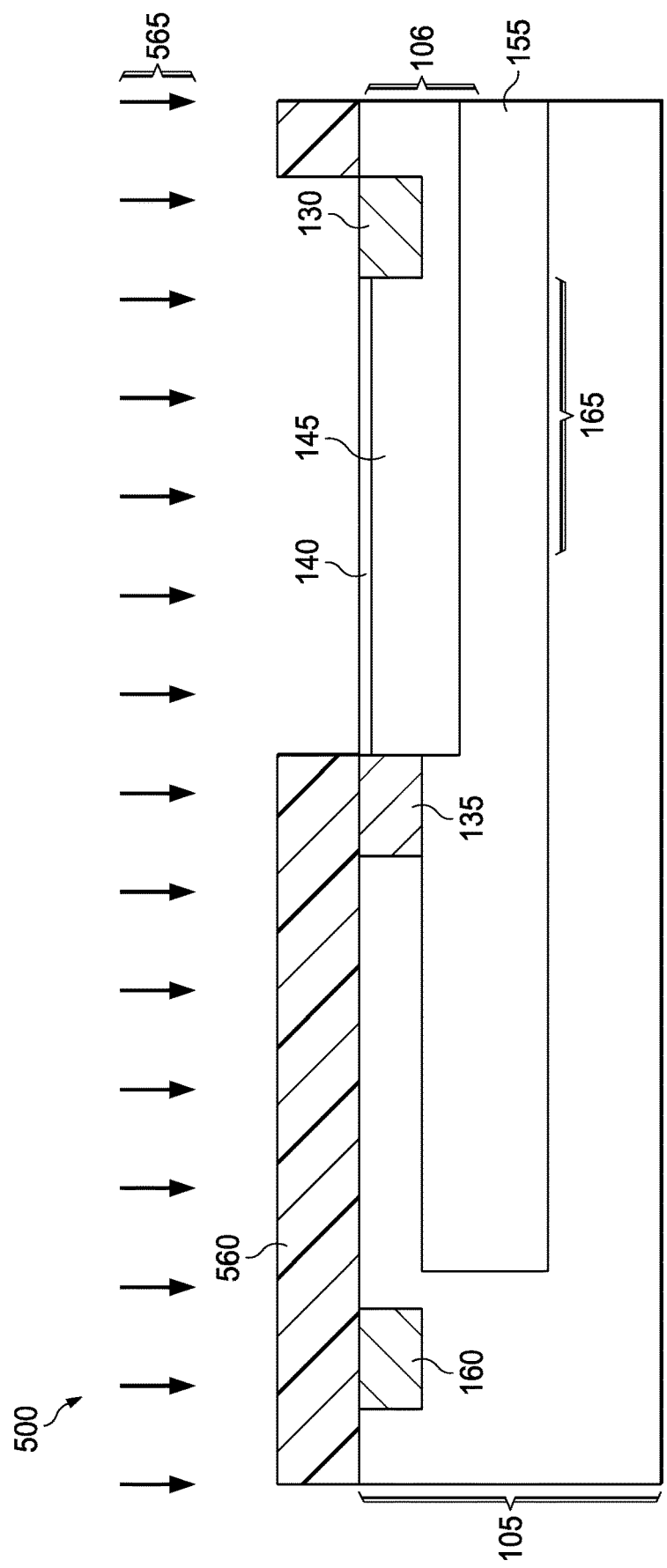

FIG. 5G illustrates the surface drift region 140 is formed in a surface layer between the drain well 130 and body well 135. A resist layer 560 includes an opening over the HV well 145 and overlaps an edge of each of the wells 130, 135. An implant process 565 provides a dopant of the first conductivity type such that a surface portion of the HV well 145 is converted, e.g. from n-type to p-type. For example, boron may be implanted with an energy of about 70 keV and a dose in a range from about 5e12 atoms/cm$^2$ to about 1e13 atoms/cm$^2$. The dopant is also implanted into the wells 130, 135 such that the surface drift region 140 is connected to both these wells. A thermal diffusion step, not shown, may be used to activate the dopant without extensive diffusion of the dopant. For example, a rapid thermal anneal (RTA) may be performed, or a subsequent thermal process may provide the activation energy, such as a field oxidation process as described below in the context of FIG. 5H.

FIG. 5H illustrates the device 100 after formation of the gate 150 over the body well 135. The field oxide layer 108 has also been formed, e.g. conventionally using a LOCOS process. An opening in the field oxide layer 108 has been formed over a portion of the body well 135 and the drift region 140. The gate dielectric 630 (see FIG. 6) has been conventionally formed on the exposed body well 135 and drift region 140, and a polysilicon layer has been formed over the gate dielectric 630. The polysilicon layer has been patterned to produce the gate 150 and the field plate 151.

Finally. FIG. 5I illustrates the device 100 after formation of a dielectric layer 175 and vias 180 within the dielectric level 185. The dielectric layer 175 has been patterned to produce via openings over the wells 130, 135, 160. After patterning, a conventional implant process has formed the contact regions 710 within the substrate contact well 160 (see FIG. 7). Similarly, the body contact 610 and source region 620 have been formed within the well 135. After the contact implants, the vias 180 have been formed conventionally.

Referring back to FIG. 2, the device 100 is shown after formation of additional dielectric layers 175 and metal layer 185. Additional instances of the vias 180 have been formed within the dielectric layers 175 to respectively connect the electrodes 110, 120 and 125 to the wells 135, 130, and 160, and the gate electrode 115 to the gate 150. Additional dielectric layers and metal connections may be formed as desired to interconnect the device 100 with other devices in an integrated circuit.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A semiconductor device, comprising:
   a MOS transistor formed within a semiconductor substrate of a first conductivity type and having a surface drift layer of the first conductivity type located between a body well and a drain well;
   a buried voltage blocking region of a second conductivity type connected to the body well and extending from the body well toward a substrate contact well; and
   an unmodified portion of the substrate located between the buried voltage blocking region and the substrate contact well.

2. The semiconductor device of claim 1, wherein the buried voltage blocking region and the substrate form a P-N junction, and the body well and the substrate contact well are configured to reverse bias the P-N junction thereby producing a non-equilibrium depletion isolation region adjacent to and including at least some of the unmodified substrate portion.

3. The semiconductor device of claim 2, wherein the non-equilibrium depletion isolation region has a breakdown voltage of at least 700 V.

4. The semiconductor device of claim 1, wherein the buried voltage blocking region extends from the body well toward the substrate contact well at least about 80% of a distance between the body well and the substrate contact well.

5. The semiconductor device of claim 1, wherein the buried voltage blocking region extends at least about 20 μm from the body well toward the substrate contact well.

6. The semiconductor device of claim 1, wherein the buried voltage blocking region extends from the body well toward the drain well.

7. The semiconductor device of claim 1, wherein the semiconductor substrate includes high-voltage (HV) well of the second conductivity type located between the body well and the drain well, and the buried voltage blocking region partially overlaps the HV well.

8. A high-voltage MOS transistor, comprising:
   a p-type substrate;
   first and second p-wells located within the substrate;
   an n-well located within the substrate between the first and second p-wells;
   a p-type surface drift region located between and connected to the n-well and the second p-well;
   a gate located over the n-well; and
   a buried n-type region that partially overlaps the n-well and extends from the n-well toward the first p-well, wherein
   the first p-well and the buried n-type region are spaced apart laterally.

9. The high-voltage MOS transistor of claim 8, wherein the n-well is a first n-well, and further comprising a second n-well between and partially overlapping the first n-well, the second p-well and the buried n-type region.

10. The high-voltage MOS transistor of claim 8, wherein the buried n-type region extends from the n-well toward the second p-well with a graded dopant profile.

11. The high-voltage MOS transistor of claim 8, wherein the n-well and the first p-well are configured to receive a potential capable of fully depleting a region of the p-type substrate between the buried n-type region and a surface of the substrate.

12. The high-voltage MOS transistor of claim 8, wherein the buried n-type region extends at least about 20 μm from the n-well toward the first p-well.

13. The high-voltage MOS transistor of claim 8, wherein the buried n-type region has a graded dopant profile that decreases in a direction from the n-well toward the second p-well.

14. An electronic device, comprising:
   a drain well of a drain-extended (DE)-MOS transistor located within a semiconductor substrate including an epitaxial layer of a first conductivity type, the semiconductor substrate and drain well having the first conductivity type;
   a body well located within the semiconductor substrate, the body well having a different second conductivity type;
   a junction termination diode located within the semiconductor substrate, the junction termination diode having first and second terminals, the first terminal connected to the semiconductor substrate at a substrate contact well having the first conductivity type, and the second terminal connected to the body well; and
   a buried region of the second conductivity type extending from the body well toward the substrate contact well, wherein an epitaxial layer portion is located between the buried region and the substrate contact well, the epitaxial layer portion having a lower dopant concentration than the substrate contact well.

15. The electronic device of claim 14, wherein the buried region extends between about 20 μm and about 200 μm from the body well toward the substrate contact well.

16. The electronic device of claim 14, wherein the second terminal is coincident with the body well.

17. The electronic device of claim 14, wherein the junction termination diode has a breakdown voltage of at least about 700 V.

18. The electronic device of claim 14, further comprising forming an HV well of the second conductivity type located between the body well and the drain well of the DE-MOS transistor, the HV well partially overlapping the buried region.

19. The electronic device of claim 14, wherein the buried region extends from the body well toward the drain well with a graded dopant profile.

20. The electronic device of claim 14, wherein the first conductivity type is p-type and the second conductivity type is n-type.

21. An integrated circuit (IC), comprising:
- an n-type body well and a p-type drain well of a drain-extended (DE)-MOS transistor located within a p-type semiconductor substrate including a p-type epitaxial layer; and
- a junction termination diode having first and second terminals located within the semiconductor substrate, the first terminal connected to the p-type semiconductor substrate at a p-type substrate contact well, and the second terminal connected to the n-type body well; and
- an n-type buried region located within the p-type epitaxial layer and extending from the n-type body well toward the substrate contact well,
- wherein an epitaxial layer portion is located between the n-type buried region and the substrate contact well, the epitaxial layer portion having a lower dopant concentration than the substrate contact well.

22. The integrated circuit (IC) of claim 21, wherein the junction termination diode has a breakdown voltage of at least about 700 V.

23. The integrated circuit (IC) of claim 21, wherein the n-type buried region extends from the n-type body well toward the substrate contact well by at least about 20 μm.

24. The integrated circuit (IC) of claim 21, wherein the second terminal is coincident with the n-type body well.

25. The integrated circuit (IC) of claim 21, further comprising an n-type high-voltage (HV) well located between the n-type body well and the p-type drain well of the DE-MOS transistor.

26. The integrated circuit (IC) of claim 25, wherein the HV well partially overlaps the n-type buried region.

27. The integrated circuit (IC) of claim 21, wherein the n-type buried region extends from the n-type body well toward the p-type drain well with a graded dopant profile.

* * * * *